United States Patent

Consolazio

[11] Patent Number: 6,094,570
[45] Date of Patent: Jul. 25, 2000

[54] DOUBLE-BALANCED MONOLITHIC MICROWAVE INTEGRATED CIRCUIT MIXER

[75] Inventor: Stephen James Consolazio, Arlington Heights, Ill.

[73] Assignee: Northrop Grumman, Los Angeles, Calif.

[21] Appl. No.: 09/073,657

[22] Filed: May 6, 1998

[51] Int. Cl.[7] .................................................. H04B 1/26
[52] U.S. Cl. ........................... 455/327; 455/333; 327/355
[58] Field of Search .................... 455/326, 327, 455/323, 333, 330; 327/355; 333/26, 119

[56] References Cited

U.S. PATENT DOCUMENTS

| | | | |
|---|---|---|---|
| 3,571,722 | 3/1971 | Vendelin | 325/445 |
| 3,611,153 | 10/1971 | Wen | 325/446 |
| 3,652,941 | 3/1972 | Neuf | 325/446 |
| 3,735,267 | 5/1973 | Napoli | 325/446 |
| 3,772,599 | 11/1973 | Ernst et al. | 325/446 |
| 4,008,438 | 2/1977 | Sinkawa et al. | 325/446 |
| 4,186,352 | 1/1980 | Hallford | 455/446 |
| 4,245,356 | 1/1981 | Hallford | 455/327 |
| 4,293,956 | 10/1981 | Altstatt | 455/327 |
| 4,306,311 | 12/1981 | Igarashi | 455/327 |
| 4,330,868 | 5/1982 | Hallford | 455/327 |
| 4,371,982 | 2/1983 | Hallford | 455/327 |
| 4,399,562 | 8/1983 | Hallford | 455/327 |
| 4,755,775 | 7/1988 | Parczewski et al. | 333/26 |
| 4,811,426 | 3/1989 | Pergande | 455/327 |
| 5,125,111 | 6/1992 | Trinh | 455/327 |
| 5,142,697 | 8/1992 | Podvin | 455/326 |
| 5,428,838 | 6/1995 | Chang et al. | 455/326 |
| 5,428,840 | 6/1995 | Sadhir | 455/327 |
| 5,740,528 | 4/1998 | Drennen | 455/327 |
| 5,917,386 | 6/1999 | Dobrovolny | 333/119 |

Primary Examiner—Edward F. Urban
Assistant Examiner—Marceau Milord
Attorney, Agent, or Firm—Terry J. Anderson; Karl J. Hoch, Jr.

[57] ABSTRACT

A double-balanced monolithic microwave integrated circuit mixer is fabricated on a GaHs substrate with a radio frequency microstrip balun formed thereon and a local oscillator microstrip balun formed thereon. A crossover diode ring is also formed upon the substrate. The radio frequency microstrip balun and the local oscillator microstrip balun provide enhanced electrical isolation between a radio frequency port and a local oscillator port, enhanced spurious response suppression, and enhanced local oscillator noise rejection in only 0.021"×0.048" of circuit area.

16 Claims, 3 Drawing Sheets

DOUBLE-BALANCED MONOLITHIC MICROWAVE INTEGRATED CIRCUIT MIXER

FIELD OF THE INVENTION

The present invention relates generally to mixers such as those used in superheterodyne radio receivers and relates more particularly to a double-balanced monolithic microwave integrated circuit mixer comprising microstrip baluns for coupling the radio signal and the local oscillator to a crossover diode ring.

BACKGROUND OF THE INVENTION

Superheterodyne radio receivers for accurately tuning to the frequency of a received radio signal are well known. As those skilled in the art will appreciate, superheterodyne radio receivers eliminate the need for multiple stages of frequency filtering in order to accurately tune a radio receiver to the desired frequency. This not only enhances tuning accuracy, but also eliminates many stages of variable band-pass filtering (tuning) and the need to precisely align such filters.

In a superheterodyne radio receiver, the received radio signal is mixed with the output of a local oscillator (LO), so as to form an intermediate frequency (IF).

Such mixing results in the formation of sum and difference frequencies according to well known principles. Typically, the difference frequency becomes the intermediate frequency (IF), which is then processed further, as desired.

Similarly, a microwave mixer receives a radio frequency (RF) signal and mixes it with the output from a local oscillator (LO) to produce an intermediate frequency (IF) signal.

Because of the short wavelength of microwaves, a microwave mixer may easily be formed upon monolithic integrated circuit chip. Microwave mixers are utilized whenever it is desirable to convert the comparatively higher frequency microwave signal to a lower frequency signal in applications such as satellite communications receivers, direct broadcasting satellite receivers, up and down converters, electronic warfare systems, etc.

Of course, in any such radio frequency system, it is highly desirable to match electrical impedances. Thus, it is desirable to match the impedance of the incoming radio frequency (RF) signal to that of the mixer, as well as to match the signal from the local oscillator (LO) thereto.

It is known to use baluns to achieve impedance matching between the mixer and the incoming radio frequency (RF) signal as well as the signal from the local oscillator (LO). However, such contemporary baluns as the classical Marchand parallel-line balun utilize parallel, generally straight microstrips to effect inductive impedance matching. As those skilled in the art will appreciate, such generally straight microstrips are not formed in a real estate efficient manner. The reason for using a balun structure is to transfer RF energy from an unbalanced structure to a balanced structure, e.g., a diode ring quad, in the case of a mixer.

Because of the very short wavelength of microwave electromagnetic radiation, such straight baluns have not been thought to occupy excessive integrated circuit surface area in the past. However, as integrated circuit fabrication techniques continue to improve, line widths and component sizes grow ever smaller, such that the physical dimensions of such contemporary straight baluns come excessive by comparison.

As such, it is desirable to provide a more compact impedance matching device or balun, wherein the surface area required therefor is substantially reduced as compared to contemporary straight line baluns.

SUMMARY OF THE INVENTION

The present invention specifically addresses and alleviates the above mentioned deficiencies associated with the prior art. More particularly, the present invention comprises a double-balanced monolithic microwave integrated circuit mixer comprising a substrate, a radio frequency microstrip balun formed upon the substrate, a radio frequency input port in electrical communication with one end of a first microstrip conductor of the radio frequency microstrip balun, a local oscillator microstrip balun formed upon the substrate, and a crossover diode ring formed upon the substrate.

A radio frequency input port is in electrical communication with one end of the first microstrip conductor of the radio frequency microstrip balun. Similarly, a local oscillator input port is in electrical communication with one end of the first microstrip conductor of the local oscillator microstrip balun.

The local oscillator microstrip balun comprises a first microstrip conductor formed so as to generally define a loop, a second microstrip conductor formed so as to be generally parallel to the first microstrip conductor, and a third microstrip conductor formed so as to be generally parallel to the first microstrip conductor.

The crossover diode ring is formed upon the substrate and has two corners thereof in electrical communication with the radio frequency microstrip balun and has two opposite corners thereof in electrical communication with the local oscillator. The output of the mixer is diplexed from two corners of the crossover diode ring at either the RF or LO feed points.

The radio frequency microstrip balun and the local oscillator microstrip balun provide enhanced electrical isolation between the radio frequency port and the local oscillator port, enhanced spurious response suppression, and enhanced local oscillator noise rejection, in addition to providing impedance matching between the radio frequency (RF) signal and the local oscillator (LO).

According to the preferred embodiment of the present invention, the first microstrip conductor of the radio frequency microstrip balun and the first microstrip conductor of the local oscillator microstrip balun both generally define a spiral, preferably a rectangular spiral.

The second and third microstrip conductors of the radio frequency microstrip balun and the second and third microstrip conductors of the local oscillator microstrip balun preferably extend more than half way around the loop defined by the first microstrip conductor of the radio frequency microstrip balun and the local oscillator microstrip balun, respectively.

The first, second, and third microstrips are preferably approximately 8 microns wide. The spacing between adjacent microstrips is preferably approximately 8 microns. The first microstrip is preferably approximately 600 microns in length.

The radio frequency microstrip balun, the local oscillator microstrip balun, and the crossover diode ring are preferably configured so as to occupy an area upon the substrate of approximately 0.533 mm×1.22 mm.

A radio frequency matching network is preferably formed intermediate the radio frequency input port and the radio frequency microstrip balun. The radio frequency matching network preferably comprises a capacitor and an inductor formed in series with one another. Similarly, a local oscillator matching is preferably formed intermediate the local oscillator input port and the local oscillator microstrip balun. The local oscillator matching network preferably comprises a capacitor and an inductor, formed in series of one another.

The substrate of the monolithic microwave integrated circuit mixer of the present invention preferably comprises a monolithic semi-insulating gallium arsenite substrate. The gallium arsenite substrate preferably has a thickness of approximately 100 microns.

The radio frequency microstrip balun, the local oscillator microstrip balun, and the crossover diode ring are preferably formed upon the substrate via a High Electron Mobility Transistor (p-HEMT) epitaxial process utilizing a 0.15 micron gate length having a unity-gain cut-off frequency greater than approximately 55 GHz. The diode of the crossover diode ring are preferably formed via a 40 micron periphery High Electron Mobility Transistor (p-HEMT) epitaxial process.

These, as well as other advantages of the present invention will be more apparent from the following description and the drawings. It is understood that changes in the specific structure shown and described may be made within the scope of the claims without departing from the spirit of the invention.

DETAILED DESCRIPTION OF THE PREFERRED EMBODIMENTS

The detailed description sets forth below in connection with the appended drawings is intended as a description of the presently preferred embodiment of the invention, and is not intended to represent the only form in which the present invention may be constructed or utilized. The description sets forth the functions and the sequence of steps for constructing and operating the invention in connection with the illustrated embodiment. It is to be understood, however, that the same or equivalent functions may be accomplished by different embodiments that are also intended to be encompassed within the spirit and scope of the invention.

Figure 1:
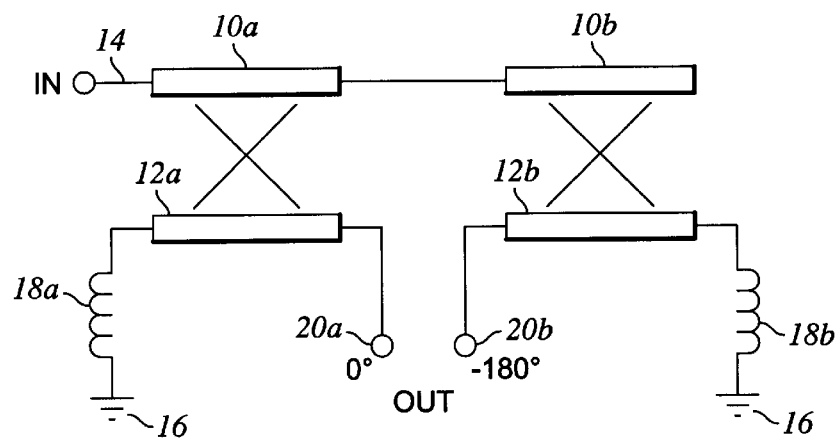
FIG. 1 is a schematic representation of the microstrip balun of the present invention.
Figure 2:
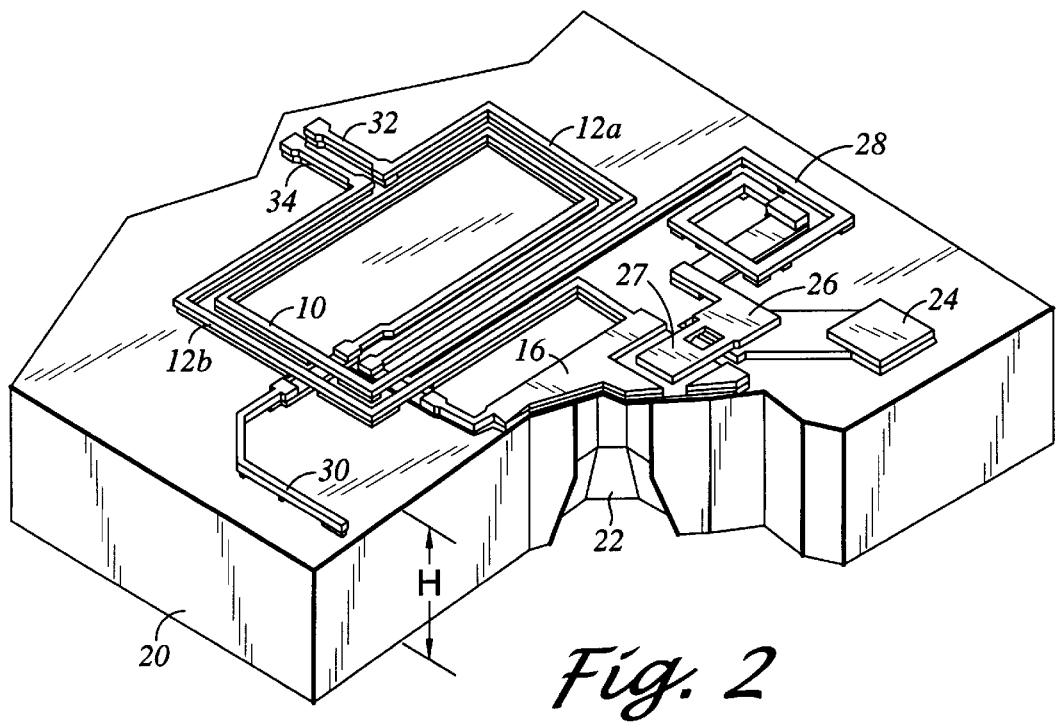
FIG. 2 is a perspective view of the microstrip balun of FIG. 1.

Referring now to FIG. 1, an radio frequency (RF) signal is provided to the input 14 of a parallel-line balun. The radio frequency (RF) signal passes through serial microstrips 10a and 10b which, may be formed as a single microstrip, as shown in FIG. 2 and discussed below. After passing through the two microstrips 10a and 10b, the radio frequency (RF) signal is coupled to microstrips 12a and 12b. Those skilled in the art will appreciate that various other circuitry, such as filters, may be in the signal path of the radio frequency (RF) signal, e.g., prior to input 14 or intermediate microstrips 10a, 10b.

Microstrips 10a, 10b induce current into corresponding microstrip 12a and 12b. Thus, microstrips 10a, 10b function as transformer primaries, while microstrips 12a and 12b function as transformer secondaries. Inductors 18a and 18b, formed in series with microstrips 12a and 12b, respectively, are backside vias which provide signal ground at the ends of microstrips 12a and 12b, which as those skilled in the art will appreciate, yields two signals which are 180° out of phase with one another when the length of microstrips 12a and 12b approach a quarter wavelength of the desired frequency band center.

The balanced structure of FIG. 1 is based upon the classical Marchand in-line balun. However, according to the present invention, the baluns are implemented with purely microstripped coupled lines in a generally spiral configuration on a semi-insulating gallium arsenide (GaAs) monolithic microwave integrated circuit (MMIC) substrate media.

Referring now to FIG. 2, the generally spiral configuration of the radio frequency (RF) balun microstrip conductors 10a, 10b, which form a single, continuous balun 10, is shown.

As can easily be seen in FIG. 2, the first microstrip conductor 10 generally defines a loop or rectangular spiral. The second 12a and third 12b microstrip conductors are formed so as to be generally parallel to the first microstrip conductor 10.

The spiral microstrip structure of the present invention possesses the distinct advantage of circuit layout compactness, while simultaneously exhibiting a very good amplitude balance of less than 1 dB and a very good phase balance of 180°±3° over a very broad range of microwave frequencies.

According to the preferred embodiment of the present invention, each first microstrip conductor 10 has a length (length being measured as that portion of the microstrip which is effective in inducing current into other the second 12a and third 12b microstrip conductor) which is dependant upon the radio frequency (RF) bands center frequency and the line impedance according to well known principles. According to the preferred embodiment of the present invention, the length of the first microstrip conductor 10 is approximately 600 microns.

The width, dimension W, of the first 10, second 12a, and third 12b, microstrip conductors is preferably 8 microns. The spacing, dimension S, between adjacent micro strip conductors is preferably approximately 8 microns. The thickness, dimension H, of the substrate is preferably approximately 100 microns.

Low inductance vias 22 provide a conductive path to the ground plane for grounded portions of the circuitry.

The length of the coupled microstrip conductors determines the balun center frequency according to well known principles. Similarly, the transmission line impedance and the degree of coupling between adjacent microstrip conductors determines the balun bandwidth. Greater transmission line coupling increases the even-mode coupled line impedance so as to provide comparatively broad bandwidth and improved voltage standing wave ratio (VSWR) at the unbalanced input port and the balanced output ports. Radio frequency is preferably applied to the balun via bond wire pad 24 which is in electrical communication with series capacitor 26 which is further in electrical communication with series inductor 28. Series capacitor 26 a capacitor 27 is also formed to ground so as to short undesirable high frequencies to ground, and thereby mitigate their introduction into the balun. Capacitors 26, 27 and inductor 28 form a matching network.

Figure 3:
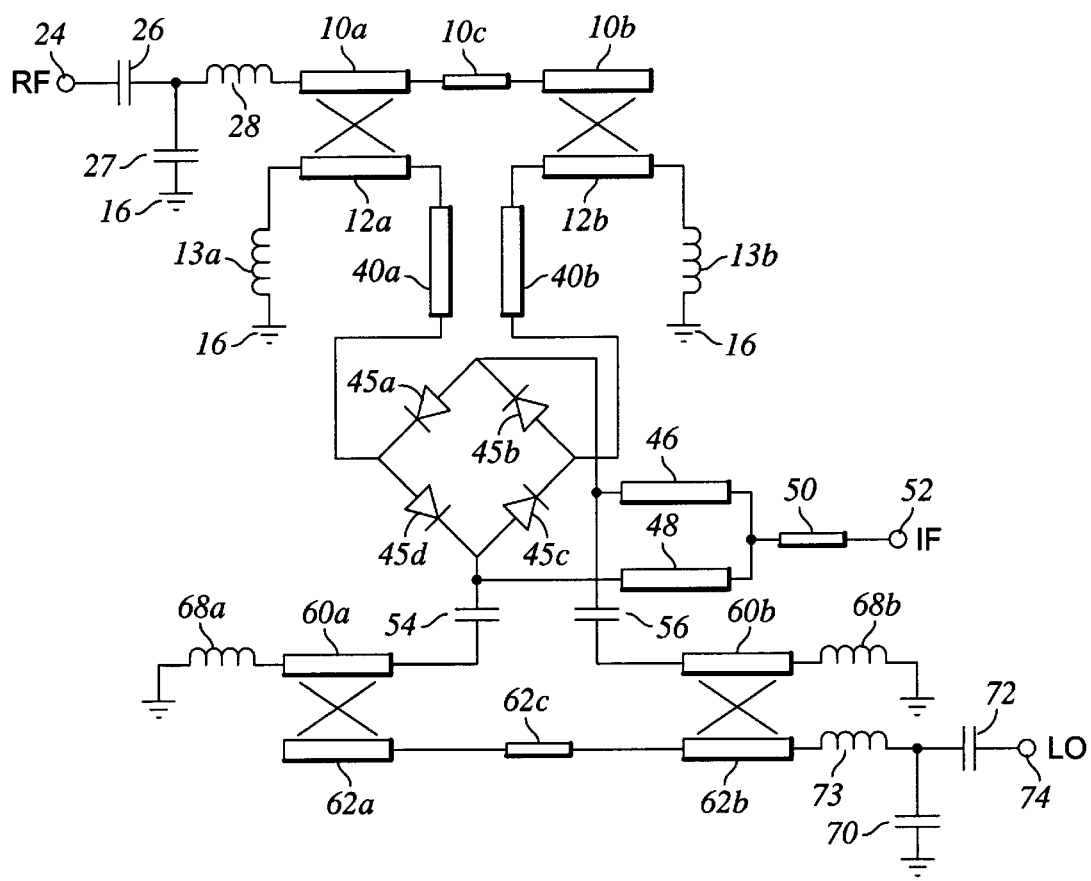
FIG. 3 is a schematic representation of the double-balanced monolithic microwave integrated circuit mixer of the present invention.

Although 10a, 10c, and 10b are shown as separate or distinct microstrip conductors in FIG. 3, they are preferably actually formed as a single, long micro strip conductor. Indeed, portions of the single, micro strip conductor 10a, 10b, 10c, referred to in FIG. 4 as 10, may induce current into both 12a and 12b simultaneously, while other portions of the single microstrip conductor 10, substantially only induce current into either microstrip conductor 10a or microstrip conductor 12b.

Capacitor 26, 27 and series inductor 28 cooperate to form a matching network for the radio frequency signal, so as to aid in the conduction of desired frequencies to the balun.

From the series conductor 28, the radio frequency (RF) signal passes through the first microstrip conductor 10 which generally defines a closed loop or spiral. The end 30 of the input microstrip, as in FIG. 1, is open. A first induced signal is formed on second microstrip conductor 12a which is provided to transmission line 32. Similarly, a second induced signal is formed on microstrip conductor 12b, which is approximately 180° out of phase with the induce signal formed on microstrip conductor 12a and which is provided on transmission line 34.

Figure 4:
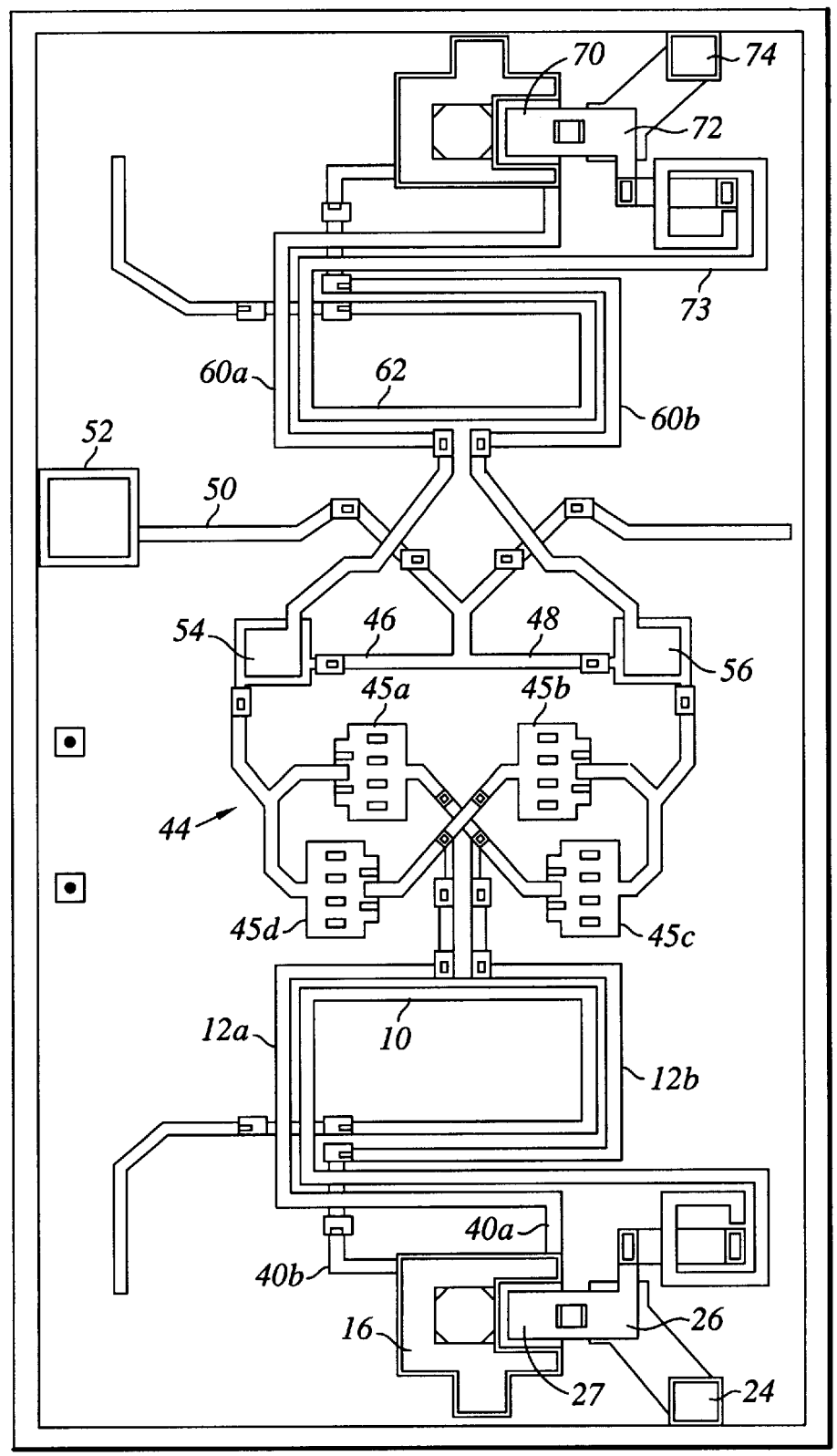
FIG. 4 is a plan view of the double-balanced monolithic microwave integrated circuit mixer of FIG. 3.

Referring now to FIGS. 3 and 4, implementation of the double balanced balun of the present invention in a monolithic microwave integrated circuit mixer is shown. According to this implementation of the balun, an radio frequency (RF) signal is applied to input 24 and passes through series capacitor 26 and inductor 28.

First microstrip conductor shown schematically in FIG. 3 as 10a, 10b, and 10c and shown as a single, continuous microstrip conductor 10 in FIG. 4. A single microwave signal is launched into the balun. The microstrips 12a and 12b are shorted to ground at each end. Given that 12a and 12b are each approximately one quarter wavelength (90°), they become open circuits at points 32 and 34. Impedance is transformed at those points and the signals are 180° out of phase only at 32 and 34 by conservation of energy law of physics. Microstrip conductors 40a and 40b provide conduction of the induced signals from the first microstrip conductor 12a and second microstrip conductor 12, respectively, to a crossover diode ring 44, comprising first diode 45a, second diode 45b, third diode 45c, and forth diode 45d formed in a standard full wave bridge rectifier configuration.

The induced signal from the first microstrip conductor 12a and the induced signal from the second microstrip conductor 12b are applied to opposite corners of the crossover diode ring 44, while outputs of the crossover diode ring are taken from the other corners thereof, as shown.

In a generally symmetric fashion to the radio frequency microstrip balun, a local operator microstrip balun is formed of local oscillator (LO) input 74, series capacitor 72 and inductor 73, grounded capacitor 70, first microstrip conductor, first microstrip conductor 62a, 62b, 62c, second micro strip conductor 60a and its associated capacitor 54 and inductor 68a, third microstrip conductor 60b and it associated capacitor 56 and inductor 68b. The output of the local oscillator microstrip balun is applied to the same corners of the crossover diode ring 44 that the output thereof is taken from.

Thus, according to the present invention a double-balanced monolithic microwave integrated circuit (MMIC) mixer is provided. According to the preferred embodiment of the present invention, the double-balanced monolithic microwave integrated circuit mixer occupies an area of only 0.021"×0.048" (0.533 mm×1.22 mm).

The generally spiral microstrip baluns of the present invention, which are utilized at the radio frequency (RF) and the local oscillator (LO) ports of the mixer facilitate high port-to-port isolation, provide spurious response suppression, and enhanced local oscillator noise rejection.

The frequency mixing mechanism of the present invention is a folded (crossover) diode ring, preferably comprising four 10 micron gate width p-HEMT diodes, which are driven at opposite corners of the ring through the radio frequency (RF) and local oscillator (LO) baluns.

As discussed above, the circuitry is preferably fabricated upon a 100 micron thick semi-insulating gallium arsenide (GaAs) substrate using pseudomorphic High Electron Mobility Transistor (p-HEMT) epitaxial process technology. The diodes are preferably constructed utilizing 40 micron periphery HEMT devices with drains and sources thereof connected together.

The 0.15 micron gate length p-HEMT devices used according to the present invention have a unity-gain cut-off frequency, $F_\tau > 55$ GHZ.

According to the present invention, conversion loss, isolation, and spurious suppression are comparable to those parameters in contemporary use in the microwave circuit industry which occupy significantly more surface area upon the substrate. As such, the present invention substantially reduces the surface area required for the construction of a double-balanced monolithic microwave integrated circuit mixer while maintaining the critical parameters thereof within a desirable range.

It is understood that the exemplary double-balanced monolithic microwave integrated circuit mixer of the present invention, which is described herein and shown in the drawings, represents only a presently preferred embodiment of the invention. Indeed, various modifications and additions may be made to such embodiment without departing from the spirit and scope of the present invention. For example, those skilled in the art will appreciate that various substrates other than gallium arsenide may be utilized. Also, various different integrated circuit fabrication techniques other than those described and shown are contemplated. Thus, these and other modifications and additions may be obvious to those skilled in the art may be implemented to adapt the present invention for use in a variety of different applications.

What is claimed is:

1. A double-balanced monolithic microwave integrated mixer comprising:

a) a substrate;

b) a radio frequency microstrip balun formed upon the substrate, the radio frequency microstrip balun comprising:
   i) a first microstrip conductor formed to generally define a loop;
   ii) a second microstrip conductor formed so as to be generally parallel to the first microstrip conductor;
   iii) a third microstrip conductor formed so as to be generally parallel to the first microstrip conductor;
   iv) a radio frequency input port in electrical communication with one end of the first microstrip conductor of the radio frequency microstrip balun;

c) a local oscillator microstrip balun formed upon the substrate, the local microstrip balun comprising:
   i) a first microstrip conductor formed to generally define a loop;
   ii) a second microstrip conductor formed so as to be generally parallel to the first microstrip conductor;
   iii) a third microstrip conductor formed so as to be generally parallel to the first microstrip conductor;

iv) a local oscillator input port in electrical communication with one end of the first microstrip conductor of the radio frequency microstrip balun;

d) a crossover diode ring formed upon the substrate and having one corner thereof in electrical communication with the radio frequency microstrip balun and having an opposite corner thereof in electrical communication with the local oscillator, an output of the mixer being provided at two remaining corners of the crossover diode ring;

e) wherein the radio frequency microstrip balun and the local oscillator microstrip balun provide enhanced electrical isolation between the radio frequency port and the local oscillator port, enhanced spurious response suppression, and enhanced local oscillator noise rejection; and f) wherein the second and third microstrip conductors of the radio frequency microstrip balun and the second and third microstrip conductors of the local oscillator microstrip balun extend more than half way around the loop defined by the first microstrip conductor of the radio frequency microstrip balun and the local oscillator microstrip balun.

2. The double-balanced monolithic microwave integrated circuit as recited in claim 1, wherein the first microstrip conductor of the radio frequency microstrip balun and the first microstrip conductor of the local oscillator microstrip balun generally define a spiral.

3. The double-balanced monolithic microwave integrated circuit as recited in claim 1, wherein the first microstrip conductor of the radio frequency microstrip balun and the first microstrip conductor of the local oscillator microstrip balun generally define a rectangular spiral.

4. The double-balanced monolithic microwave integrated circuit as recited in claim 1, wherein:
   a) the first, second and third microstrip conductors, in the radio frequency microstrip balun and the local oscillator microstrip balun, are approximately 8 microns wide;
   b) a spacing between adjacent microstrips is approximately 8 microns; and
   c) the first microstrip is approximately 600 microns in length.

5. The double-balanced monolithic microwave integrated circuit as recited in claim 1, wherein the radio frequency microstrip balun, the local oscillator microstrip balun, and the crossover diode ring are configured to occupy an area of approximately 0.533 mm×1.22 mm.

6. The double-balanced monolithic microwave integrated circuit as recited in claim 1, further comprising:
   a) a radio frequency filter formed intermediate the radio frequency input port and the radio frequency microstrip balun, the radio frequency filter comprising:
      i) a capacitor; and
      ii) an inductor;
      iii) wherein the capacitor and the inductor are formed in series with one another; and
   b) a local oscillator filter formed intermediate the local oscillator input port and the local oscillator microstrip balun, the local oscillator filter comprising:
      i) a capacitor; and
      ii) an inductor;
      iii) wherein the capacitor and the inductor are formed in series with one another.

7. The double-balanced monolithic microwave integrated circuit mixer as recited in claim 1, wherein the substrate of the monolithic microwave integrated circuit comprises a monolithic Gallium Arsenide substrate.

8. The double-balanced monolithic microwave integrated circuit as recited in claim 1, wherein the substrate comprises a semi-insulating Gallium Arsenide substrate.

9. The double-balanced monolithic microwave integrated circuit as recited in claim 1, wherein the substrate comprises a Gallium Arsenide substrate having a thickness of approximately 100 microns.

10. The double-balanced monolithic microwave integrated circuit as recited in claim 1, wherein the radio frequency microstrip balun, the local oscillator microstrip balun, and the crossover diode ring are formed upon the substrate via a High Electron Mobility Transistor (p-HEMT) epitaxial process.

11. The double-balanced monolithic microwave integrated circuit as recited in claim 1, wherein the radio frequency microstrip balun, the local oscillator microstip balun, and the crossover diode ring are formed upon the substrate via a High Electron Mobility Transistor (p-HEMT) epitaxial process utilizing a 0.15 micron gate length having a unity-gain cut-off frequency greater than approximately 55 GHz.

12. The double-balanced monolithic microwave integrated circuit as recited in claim 1, wherein the diodes of the crossover diode ring are formed via a 40 micron periphery High Electron Mobility Transistor (p-HEMT) epitaxial process.

13. A double-balanced monolithic microwave integrated mixer comprising:
   a) a substrate;
   b) a radio frequency microstrip balun formed upon the substrate, the radio frequency microstrip balun comprising:
      i) a first microstrip conductor formed to generally define a loop;
      ii) a second microstrip conductor formed so as to be generally parallel to the first microstrip conductor;
      iii) a third microstrip conductor formed so as to be generally parallel to the first microstrip conductor;
      iv) a radio frequency input port in direct connection with one end of the first microstrip conductor of the radio frequency microstrip balun;
   c) a local oscillator microstrip balun formed upon the substrate, the local microstrip balun comprising:
      i) a first microstrip conductor formed to generally define a loop;
      ii) a second microstrip conductor formed so as to be generally parallel to the first microstrip conductor;
      iii) a third microstrip conductor formed so as to be generally parallel to the first microstrip conductor;
      v) a local oscillator input port in direct connection with one end of the first microstrip conductor of the radio frequency microstrip balun;
   d) crossover diode ring formed upon the substrate and having a pair of corners thereof in direct connection with the radio frequency microstrip balun and having a pair of opposite corners thereof in direct connection with the local oscillator microstrip balun, an output of the mixer being provided at either pair of corners;
   e) wherein the radio frequency microstrip balun and the local oscillator microstrip balun provide enhanced electrical isolation between the radio frequency port and the local oscillator port, enhanced spurious response suppression, and enhanced local oscillator noise rejection.

14. A double-balanced monolithic microwave integrated mixer comprising:

a) a substrate;

b) a radio frequency microstrip balun formed upon the substrate, the radio frequency microstrip balun comprising:
 i) a first microstrip conductor formed to generally define a loop;
 ii) a second microstrip conductor formed so as to be generally parallel to the first microstrip conductor;
 iii) a third microstrip conductor formed so as to be generally parallel to the first microstrip conductor;
 iv) a radio frequency input port in electrical communication with one end of the first microstrip conductor of the radio frequency microstrip balun;

c) a local oscillator microstrip balun formed upon the substrate, the local microstrip balun comprising:
 i) a first microstrip conductor formed to generally define a loop;
 ii) a second microstrip conductor formed so as to be generally parallel to the first microstrip conductor;
 iii) a third microstrip conductor formed so as to be generally parallel to the first microstrip conductor;
 iv) a local oscillator input port in electrical communication with one end of the first microstrip conductor of the radio frequency microstrip balun;

d) a crossover diode ring formed upon the substrate and having one corner thereof in electrical communication with the radio frequency microstrip balun and having an opposite corner thereof in electrical communication with the local oscillator microstrip balun, an output of the mixer being provided at either pair of corners of the crossover diode ring;

e) wherein the radio frequency microstrip balun and the local oscillator microstrip balun provide enhanced electrical isolation between the radio frequency port and the local oscillator port, enhanced spurious response suppression, and enhanced local oscillator noise rejection; and f) wherein the second and third microstrip conductors of the radio frequency microstrip balun and the second and third microstrip conductors of the local oscillator microstrip balun extend more than half way around the loop defined by the first microstrip conductor of the radio frequency microstrip balun and the local oscillator microstrip balun.

15. The double-balanced monolithic microwave integrated circuit mixer as recited in claim 13 or 14, wherein the substrate of the monolithic microwave integrated circuit comprises a monolithic Gallium Arsenide substrate.

16. The double-balanced monolithic microwave integrated circuit mixer as recited in claim 13 or 14, wherein the substrate of the monolithic microwave integrated circuit comprises a semi-insulating Gallium Arsenide substrate.

* * * * *